(12) United States Patent
    Sy

(10) Patent No.: US 12,575,070 B2
(45) Date of Patent: Mar. 10, 2026

(54) ALIGNMENT OF LIQUID COOLING MANIFOLDS

(71) Applicant: Dell Products L.P., Round Rock, TX (US)

(72) Inventor: Ben John Sy, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 103 days.

(21) Appl. No.: 18/424,146

(22) Filed: Jan. 26, 2024

(65) Prior Publication Data

US 2025/0248006 A1     Jul. 31, 2025

(51) Int. Cl.
    *H05K 7/20*        (2006.01)
    *F28F 9/06*        (2006.01)
    *H05K 7/14*        (2006.01)
(52) U.S. Cl.
    CPC ........... *H05K 7/20781* (2013.01); *F28F 9/06* (2013.01); *H05K 7/1489* (2013.01); *F28F 2280/02* (2013.01)
(58) Field of Classification Search
    None
    See application file for complete search history.

(56) References Cited

U.S. PATENT DOCUMENTS

| | | | |
|---|---|---|---|
| 2022/0192054 A1* | 6/2022 | DeMars ................. | F28F 9/002 |
| 2023/0052671 A1* | 2/2023 | Stammer ............... | F28F 9/0256 |
| 2023/0200024 A1* | 6/2023 | Gao .................. | H05K 7/20272 |
| | | | 361/699 |
| 2023/0354543 A1* | 11/2023 | Demars .............. | H05K 7/20272 |
| 2024/0130079 A1* | 4/2024 | Stammer ........... | H05K 7/20781 |

* cited by examiner

*Primary Examiner* — Mukundbhai G Patel
(74) *Attorney, Agent, or Firm* — Fogarty LLP

(57)                ABSTRACT

Methods and systems are provided for aligning liquid cooling manifolds of a computing rack, where the alignment allows IHSs (Information Handling Systems, such as rack-mounted servers) to be blindly coupled to these manifolds when inserted into a slot of the rack. A first alignment tray is inserted in slot of the rack until alignment couplings of the tray are coupled to the liquid cooling manifold of the rack. A second alignment tray is inserted in another slot of the rack until alignment couplings of the second tray are coupled to the liquid cooling manifold. The liquid cooling manifold is fastened to the rack while the liquid cooling manifold is coupled to the trays. The trays are removed and an IHS is inserted into a slot of the rack until coupled to the liquid cooling manifold, where couplings of the IHS are aligned with couplings of the liquid cooling manifold.

20 Claims, 5 Drawing Sheets

ALIGNMENT OF LIQUID COOLING MANIFOLDS

FIELD

This disclosure relates generally to Information Handling Systems (IHSs), and, more specifically, to supporting liquid cooling of IHSs.

BACKGROUND

An Information Handling System (IHS) generally processes, compiles, stores, and/or communicates information or data for business, personal, or other purposes. IHSs may include a variety of hardware and software components that are configured to process, store, and communicate information and may include one or more computer systems, data storage systems, and networking systems. Groups of IHSs may be housed within data center environments. A data center may include a large number of IHSs, such as server chassis that are stacked and installed within racks. A data center may include large numbers of such server racks that are organized into rows of racks. Administration of such large groups of IHSs may require teams of remote and local administrators working in shifts in order to support around-the-clock availability of the data center operations while minimizing any downtime.

As IHS hardware components, such as processors and memory, have increased in speed and power consumption, the amount of heat produced by such components during operation of an IHS has also increased. Often, the temperatures of IHS hardware components must be kept within a well-defined range in order to prevent overheating, instability, malfunction, and/or damage that would lead to a shortened component lifespan and lowered datacenter reliability. Accordingly, cooling systems are used in IHSs in order to remove heat that is generated by hardware components. In passive airflow cooling systems, cooling fans are used to force heated air away from a hardware component, and to ventilate heated air away from cooling fins or other heat dissipating structures of the component. In an active, liquid cooling system, a heat-exchanging cold plate is thermally coupled to an IHS component that is to be cooled, and a chilled fluid is passed through conduits internal to the cold plate in order to remove heat from that component. The heated liquid is then cooled and recirculated.

SUMMARY

In various embodiments, methods and systems are provided for aligning liquid cooling manifolds of a computing rack. Embodiments may include: inserting a first alignment tray in a first slot of the rack until alignment couplings of the first alignment tray are coupled to a first liquid cooling manifold of the rack; inserting a second alignment tray in a second slot of the rack until alignment couplings of the second alignment tray are coupled to the first liquid cooling manifold of the rack; fastening the first liquid cooling manifold to the rack while the liquid cooling manifold is coupled to the first alignment tray and also coupled to the second alignment tray; removing the first alignment tray and the second alignment tray from the rack; and inserting an IHS (Information Handling System) into a slot of the rack until a first liquid cooling coupling of the IHS is connected to a coupling of the first liquid cooling manifold, wherein the first liquid cooling coupling of the IHS is aligned with the coupling the first liquid cooling manifold based on the fastening of the first liquid cooling manifold to the rack while the first liquid cooling manifold is coupled to the first alignment tray and the second alignment tray.

In some embodiments, the first alignment tray is inserted into a top slot of the rack and the second alignment tray is inserted into a bottom slot of the rack. In some embodiments, the first alignment tray is identical to the second alignment tray. In some embodiments, the first liquid cooling manifold is fastened to the a top cover of the rack via top bracket. In some embodiments, the first liquid cooling manifold is fastened to the a base of the rack via bottom bracket. In some embodiments, the first liquid cooling manifold is fastened to the a cross brace of the rack via middle bracket. In some embodiments, the fastening fixes the top bracket, bottom bracket and middle bracket to the first liquid cooling manifold and to the rack. In some embodiments, the first liquid cooling manifold is loosely attached to the rack by the top bracket, bottom bracket and middle bracket until the fastening fixes the brackets. Some embodiments may further include fastening a second liquid cooling manifold to the rack while the second liquid cooling manifold is coupled to alignment couplings of the first alignment tray and also coupled to alignment couplings of the second alignment tray. In some embodiments, a second liquid cooling coupling of the IHS is aligned with the coupling the second liquid cooling manifold based on the fastening of the second liquid cooling manifold to the rack while the second liquid cooling manifold is coupled to the first alignment tray and the second alignment tray.

BRIEF DESCRIPTION OF THE DRAWINGS

The present invention(s) is/are illustrated by way of example and is/are not limited by the accompanying figures, in which like references indicate similar elements. Elements in the figures are illustrated for simplicity and clarity and have not necessarily been drawn to scale.

DETAILED DESCRIPTION

Figure 1:
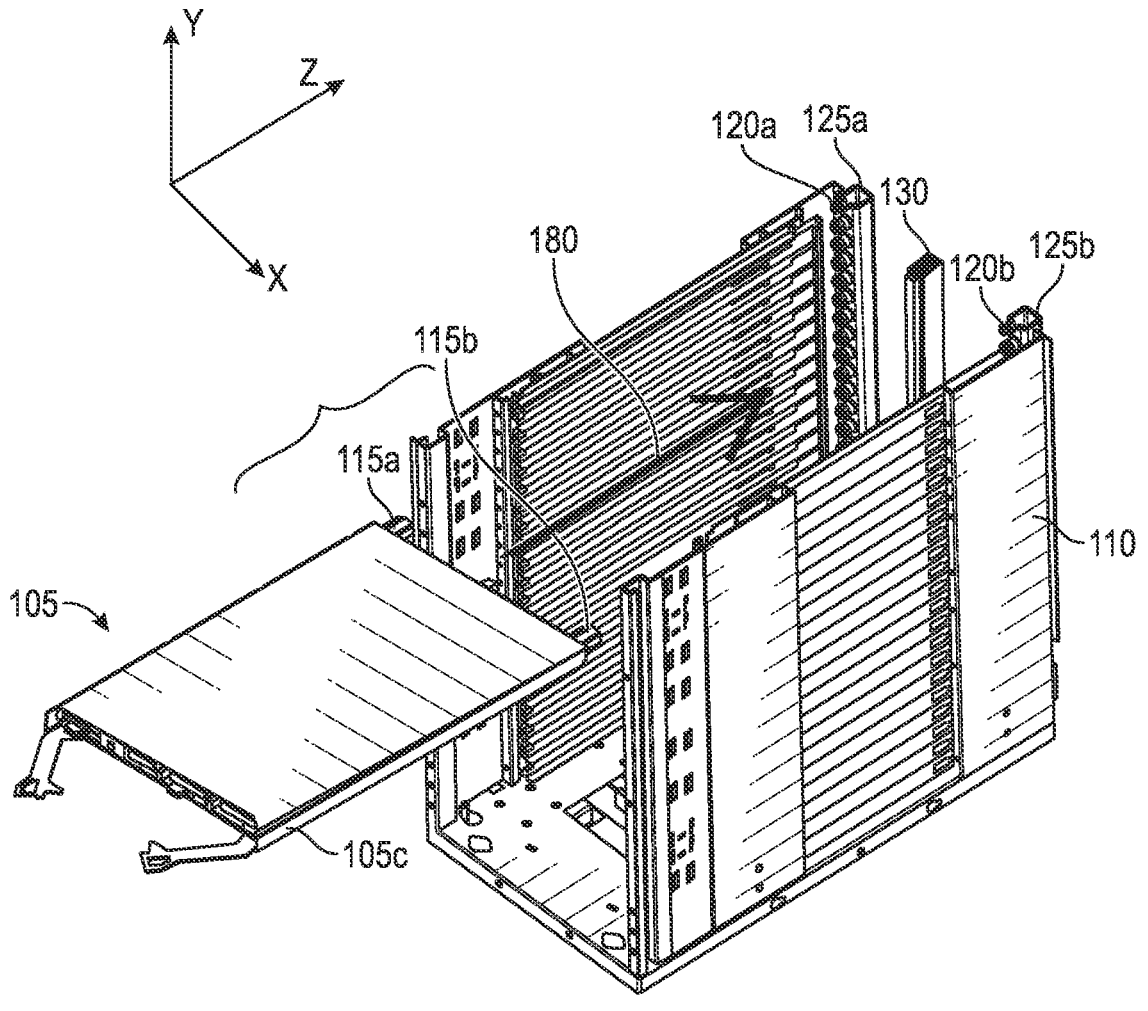
FIG. 1 is an illustration of a server IHS being inserted into a slot of rack in order to couple the server to liquid cooling manifolds supported by the rack.

FIG. 1 is an illustration of a server IHS 105 being inserted into a slot of computing rack 110, where the server may share resources provided by the rack, such as shared cooling and power provided by the rack. Accordingly, the insertion of server IHS 105 into a slot of rack 110 couples the server IHS to liquid cooling manifolds 125a-b provided by the rack. In a data center environment, a server IHS 105 may be installed within a rack 110 along with other similar IHSs, such as other server IHSs that are likewise installed in one or more slots of rack 100, where some or all of these server IHSs may be similarly coupled to liquid cooling manifolds 125a-b provided by the rack 110. A rack 110 includes multiple slots in which a server IHS 105 can be physically inserted by an administrator, where the server is instead by force applied by an administrator in the direction 180 illustrated in FIG. 1. At various occasions, administration of a sever IHS 105 may require removal of the server from the rack 110, in which case an administrator uses the illustrated handles to pull the server from its slot in the rack 110.

When installing server IHS 105 within rack 110, the force applied in direction 180 by the administrator inserts the server into a slot of the rack and also couples the server to shared infrastructure resources of the IHS. For instance, the force applied in direction 180 couples the server IHS 105 to a busbar 130 that provides the server with a supply of power, where the busbar 130 provides a shared power supply used by some or all of the hardware installed in rack 110. In addition, the force applied by the administrator in direction 180 couples the server IHS 105 to liquid cooling manifolds 125a-b provided by the rack. Rack 110 includes an inlet coolant manifold for distributing cooled liquid received from a recirculation system to server IHS 105 and an outlet coolant manifold for receiving heated liquid from server IHS 105. In the illustrated embodiments, the liquid cooling manifolds 125a-b may arranged with either of the manifolds as the inlet manifold and the other as the outlet manifold, with this arrangement selected to correspond to arrangement of liquid cooling couplings 115a-b of the server IHS 105 and of the other server IHSs or other hardware using the shared liquid cooling resources supported by rack 110. The use of liquid cooling manifolds 125a-b enables the cooling of multiple servers and/or other hardware by a single cooling source (e.g., a liquid recirculation system).

Through the force applied by the administrator in direction 180, liquid cooling couplings 115a-b of the server IHS 105 are connected to corresponding couplings 120a-b of each of the liquid cooling manifolds 125a-b. Once coupled, the liquid cooling couplings 115a-b are connected to internal inlet and outlet liquid coolant lines 105a-b of the server IHS 105. In some embodiments, the liquid cooling couplings 115a-b of the server IHS 105 and the couplings 120a-b of the liquid cooling manifolds 125a-b may be quick-connect couplings that can be connected without use of tools and solely via the force applied by the administrator in direction 180. Through the use of such quick-connect couplings, the coupling of server IHS 105 to the liquid cooling manifolds 125a-b may thus be completed blindly by the administrator that is inserting the server into a slot in the rack 110, while unable to view the liquid cooling couplings 115a-b that are being connected.

Since such couplings must be completely blindly, the administrator is unable to view and make adjustments in aligning the couplings 115a-b of the server and the couplings 120a-b of the liquid cooling manifolds 125a-b. Accordingly, precise alignment of the liquid cooling manifolds 125a-b with respect to the rack 110 in which the server IHS 105 is being installed facilitates the administrator being able to blindly connect the server to the liquid cooling system of the rack. As described in additional detail below, embodiments support alignment of liquid cooling manifolds 125a-b at precise locations within rack 110, thus supporting the administrator being able to blindly couple the server to the liquid cooling manifolds as the administrator inserts the server into the rack.

In many instances, racks 110 are constructed according to standardized dimensions that define the vertical and horizontal dimensions of hardware components, such as one or more server IHSs 105, that can be installed within such racks. Standardized rack dimensions specify vertical units of space within a rack, where such vertical units of rack space may be referred to as RUs (Rack Units). In some instances, a server IHS 105 may be one rack unit (1RU) in height and may house a single IHS. In other instances, a sever installed in a rack 110 may be multiple rack units in height and may include multiple IHSs. For example, a 2RU chassis may include a pair of front-facing bays that are each 1RU in height. In such a chassis, each of the bays may receive a 1RU IHS that may be separately administered and may be a replaceable component that may be coupled and de-coupled from a chassis. In such instance, the 2RU chassis may be coupled to liquid cooling manifolds 125a-b of rack 100 and may provide cooling for the 1RU IHSs that are installed in the chassis.

Server IHS 105 and other hardware may be installed within one or more slots that are supported by the rack 110, where use of multiple slots may correspond to the server being multiple RUs in height. Through insertion in slots supported by the rack 110, server IHS 105 may be reliably located relative to the rack itself, at least with respect to vertical and horizontal (x and y dimensions in the axis illustrated in FIG. 1) positioning of the server relative to the rack. Such positioning of the server IHS 105 may be supported by various guides and/or other structures that are located along the sides 105c of the outer enclosure of the server. These guides along the sides 105c of the server are received by corresponding rails or other precisely positioned structures along the inner walls of the rack 110.

Figure 2:
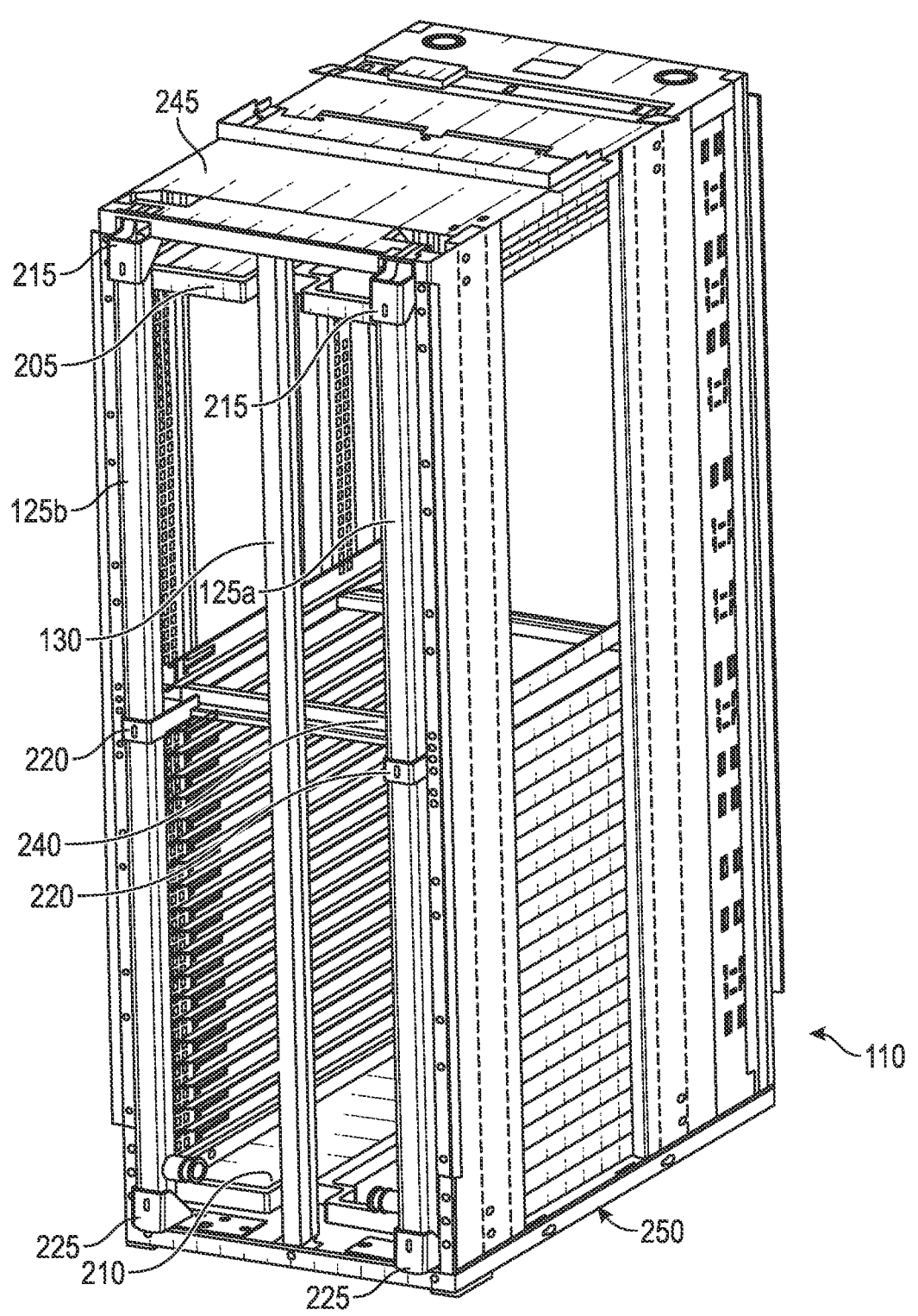
FIG. 2 is an illustration of a rack that includes liquid cooling manifolds and alignment trays, according to embodiments.

FIG. 2 is an illustration of a rack that includes liquid cooling manifolds and alignment trays, according to embodiments. FIG. 2 illustrates a rear-facing view of a partially assembled rack 110. In some instances, rack 110 includes a frame structure, that may include side panels with rails, brackets, guides or other precisely located structures for receiving corresponding structures of a server IHS 105, or other hardware that installed in one or more slots of the rack 110. The frame structure may include may include a base 250 and a top cover 245 that may be connected via any number of vertical panels, braces, posts, supports, etc. The frame structure of the rack 110 may include one or more precisely located cross braces 240 that provide lateral stability, and in many instances may be located approximately midway along the vertical height of the rack 110.

In the rear-facing view of FIG. 2, the length of busbar 130 is visible as it extends the vertical height of the rack 110, from the base 150 to the top cover 145 in providing a shared supply of power for the hardware components that are installed in the rack. Also visible in FIG. 2 is the full length of the liquid cooling manifolds 125a-b that also extend the vertical height of the rack 110. In the illustrated embodiment, each of the liquid cooling manifolds 125a-b are attached to the rack 110 via three brackets 215, 220, 225. In particular, each of the liquid cooling manifolds 125a-b is attached to the top cover 245 of the rack 110 via a respective top bracket 215, and is also attached to the base 250 via a respective lower bracket 225, and is also attached to a cross brace 240 via a respective middle bracket 220.

Through the fastening of brackets 215, 220, 225, each of the liquid cooling manifolds 125a-b is firmly fixed to rack 110, while the couplings 120a-b of the liquid cooling manifolds 125a-b are aligned with rack, and thus with the liquid cooling couplings 115a-b of a server IHS 105 installed in a slot of the IHS. Aligned in this manner, an administrator is able to insert a server IHS 105 into the rack and apply force on the server until liquid cooling couplings 115*a-b* of the server are connected with corresponding couplings 120*a-b* of the liquid cooling manifolds 125*a-b*. However, in order for these liquid cooling couplings 120*a-b*, 125*a-b* to be precisely aligned to facilitate these connections, the liquid cooling manifolds 125*a-b* should be precisely located with respect to rack 110 prior to tightening the fasteners that fix the brackets 215, 220, 225 to the rack 110. Any misalignment of the liquid cooling manifolds 125*a-b* with respect to rack 110 may result in misalignment of couplings 120*a-b*, 125*a-b*, which may prevent blind coupling of a server IHS 105 to the liquid cooling manifolds 125*a-b* of the rack.

Accordingly, in some embodiments, a pair of alignment trays 205, 210 may be utilized in precisely positioning the liquid cooling manifolds 125*a-b* relative to the rack prior to fixing the brackets 215, 220, 225 to the rack 100. As described, rack 110 includes one or more precisely positioned slots that receive hardware components, such as server IHS 105. In embodiments, alignment trays 205, 210 are designed and manufactured to be received by slots of a rack 110, in the same manner as a server IHS 105. As such, alignment trays 205, 210 may be inserted into respective slots of the rack 110 by an administrator and may be pushed in direction 180 until the trays are each coupled to the liquid cooling manifolds 125*a-b*, where the manifolds may be loosely attached to the rack 110 during insertion of the alignment trays 205, 210.

As indicated in FIG. 2, a top alignment tray 205 is inserted in the topmost slot of the rack 110, and a lower alignment tray 210 is inserted in the bottom slot of the rack 110. In some instances, the top alignment tray 205 is inserted in a slot that is near the top and the lower alignment tray 210 is inserted in the slot that is near the bottom of the rack 110. In some embodiments, alignment trays 205, 210 may be identical. As described in additional detail below, in some embodiments, the top and bottom alignment trays 205, 210 may differ to account for structural differences at the top and bottom slots of the rack 210. In some embodiments, the top alignment tray 205 may be designed to account for any dimensions and/or structural features that are particular to the topmost slot of rack 110 and the lower alignment tray 210 may be likewise designed to account for particular dimension and/or structures of the bottom slot of the rack 110, such as different geometries of busbar 130 at the bottom of the rack versus at the top of the rack. In typical scenarios, an administrator will use alignment trays 205, 210 while rack 110 is in an empty state, similar to that illustrated in FIG. 2. Accordingly, an administrator has the access that may be required to physically couple the alignment trays 205, 210 to the liquid cooling manifolds 125*a-b* that are loosely attached to the rack 110 using the brackets until these couplings have been successfully made for both the top and bottom alignment trays 205, 210.

Figure 3:
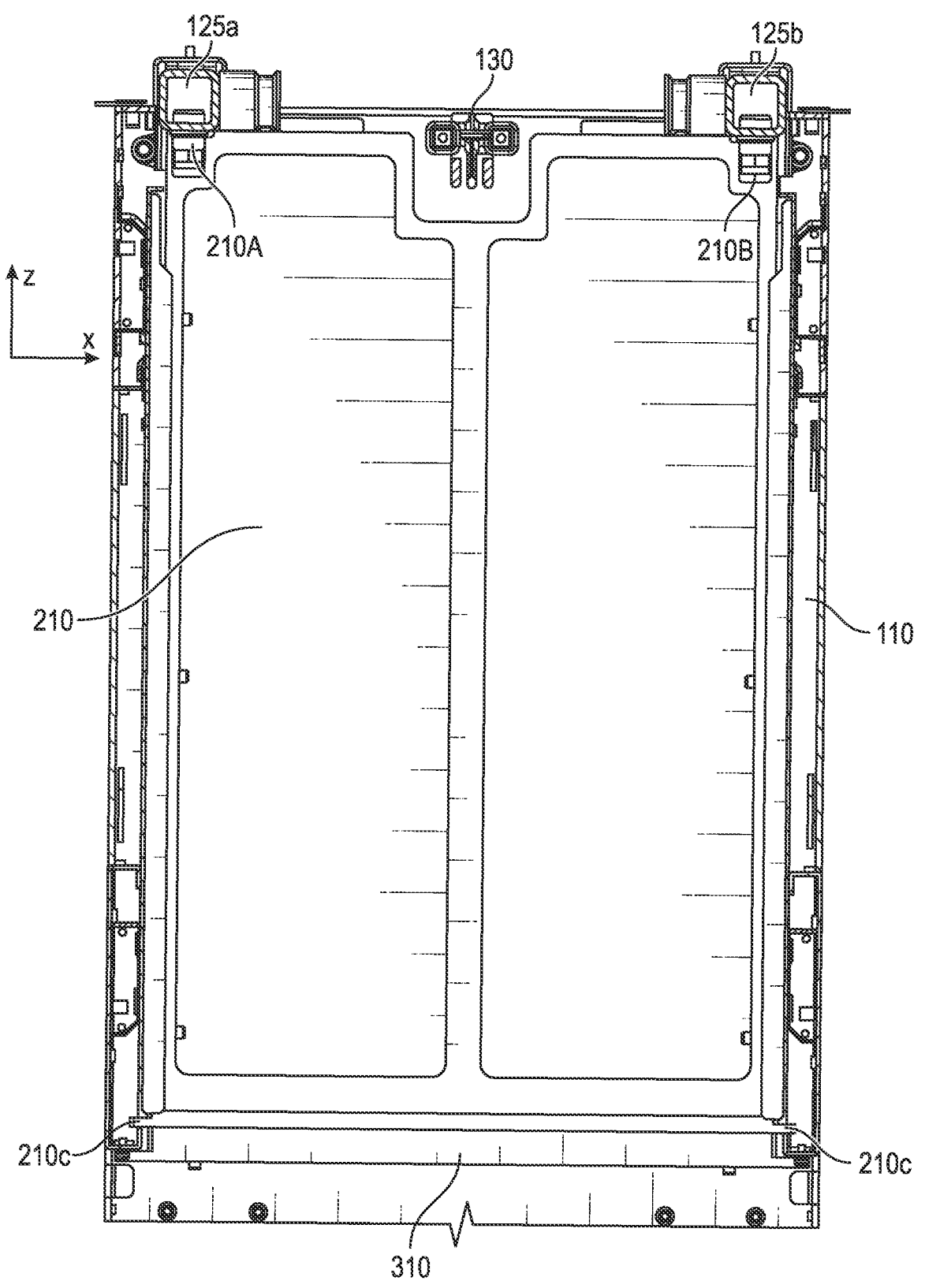
FIG. 3 is a top-view cutaway illustration of a rack that includes liquid cooling manifolds and a lower alignment tray, according to embodiments.

FIG. 3 is a top-view cutaway illustration of a rack 110 that includes liquid cooling manifolds 125*a-b* and also includes a lower alignment tray 210, according to embodiments. In FIG. 3, the lower alignment tray 210 is fully inserted into the lowest slot of the rack 110. When fully inserted into this slot, alignment couplings 210*a-b* of the lower alignment tray 210 are coupled to the liquid cooling manifolds 125*a-b*. In the cutaway view of FIG. 3, a cross section of the busbar 130 is illustrated. As illustrated, the lower alignment tray 210 is designed in a manner that circumvents the busbar 130 such that the tray can be fully inserted into the slot and coupled to the liquid cooling manifolds 125*a-b* without contacting the busbar. Also, in the cutaway view of FIG. 3, cross sections of each of the liquid cooling manifolds 125*a-b* are illustrated, showing the internal channels through which coolant flows to and from the quick-connect liquid cooling couplings of hardware components that are installed in the rack.

As described, the precisely located rails, guides and/or other structures that are along the walls of the rack 110 and that are along the sides of the enclosure of a server IHS 105 provide precises positioning of an IHS with respect to the x and y axis of the rack 110. With the lower alignment tray 210 using the same alignment features of an IHS for positioning within a slot of a rack, the lower alignment tray 210 is precisely positioned with respect to the x and y axis of the rack 110 by the administrator sliding the tray into the lowest slot of the rack. As illustrated in FIG. 3, in some embodiments, the lower alignment tray 210 may include a pair tabs 210*c* that are designed to fit within openings that are located at regular intervals along a vertical (y-axis) plane of a rack 110, that may be referred to as a datum A plane in some rack 110 embodiments. In some embodiments, the tabs 210*c* may be integral structures of alignment tray 210. In some embodiments, tabs 210*c* may part of a separate component that is inserted into the openings provided by rack 110 after insertion of the alignment tray 210 into the slot. For instance, tabs 210*c* may be structures of a cross brace that is installed across the width (x-direction) of the slot such that each of the tabs is held in place within the opening of the rack 110.

In some instances, some movement of the tray 210 may be possible due to minor shifting of tabs 210*c* within the openings of the rack 110. Accordingly, as illustrated in FIG. 3, these tabs 210*c* and the entire lower alignment tray 210 may be fixed in place through the use of a clamp bar 310 that is installed across the width of the slot and fastened to the alignment tray 210 and to the rack 110 itself, thus locking the alignment tray in place with no further movement of the tray possible. In some embodiments, clamp 310 may be bolted to the rack 110 and to the portion of tray 310 that includes tabs 210*c*, or to the cross brace that includes tabs 210*c* and that has been inserted into place. When placed in the lower slot of a rack with tabs 210*c* located in datum A openings of the rack and with clamp 310 preventing any movement of the tabs 210*c*, and thus also preventing movement of the tray 210, the front-facing edge of the lower alignment tray 210 is directly against clamp 310 that is installed in the rack 110. With the lower alignment tray 210 fixed in place and aligned in the rack with respect to the x, y an z axis, the liquid cooling manifolds may now be fastened in place. In embodiments, the upper alignment tray 205 may be fixed in place in this same manner, using a clamp 310 that is fastened to the tabs of the upper alignment tray 205, where these tabs have been inserted into openings in a slot near the top of rack 110.

Figure 4:
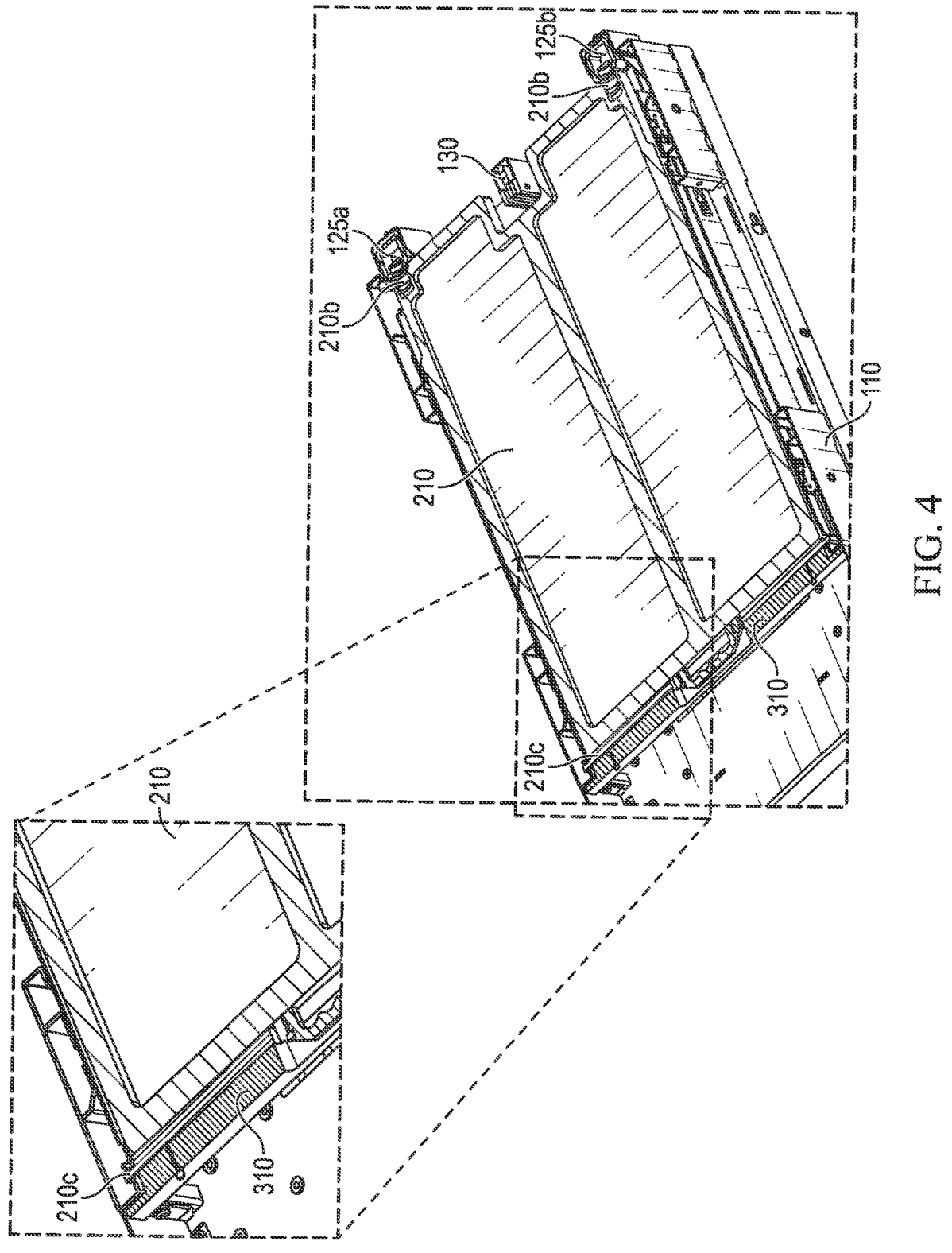
FIG. 4 is a different perspective of a cutaway top-view illustration of a rack that includes liquid cooling manifolds and a lower alignment tray, according to embodiments, and a magnified view of an alignment feature of the alignment tray.

FIG. 4 is a different perspective of a cutaway top-view illustration of a rack 110 that includes liquid cooling manifolds 125*a-b* and a lower alignment tray 210, according to embodiments, and a magnified view of the use of tabs 210*c* for precisely positioning the alignment tray relative to the rack 110. As in FIG. 3, the lower alignment tray 210 is illustrated when fully installed, with the alignment couplings 210*b* of the lower alignment tray 210 connected to the couplings of the liquid cooling manifolds 125*a-b*. As indicated in the magnified view of FIG. 4, the positioning of the lower alignment tray 210 within the slot of the rack includes the positioning of tabs 210*c* within precisely positioned openings in the side panels of the rack 110. Also as illustrated, the front face of the lower alignment tray 210 is fixed directly against clamp 310 that has been installed in the rack. In embodiments where tabs 210c are part of a separate component from alignment tray 210, the front face of the tray is fixed directly against the cross brace that includes tabs 210c, which in turn is fixed in place by clamp 310. With tabs 210c inserted into the openings provided in the frame of the rack 110 and the lower alignment tray 210 is fixed in place via clamp 310, y-axis movement by the lower alignment tray 210 is prevented.

Figure 5:
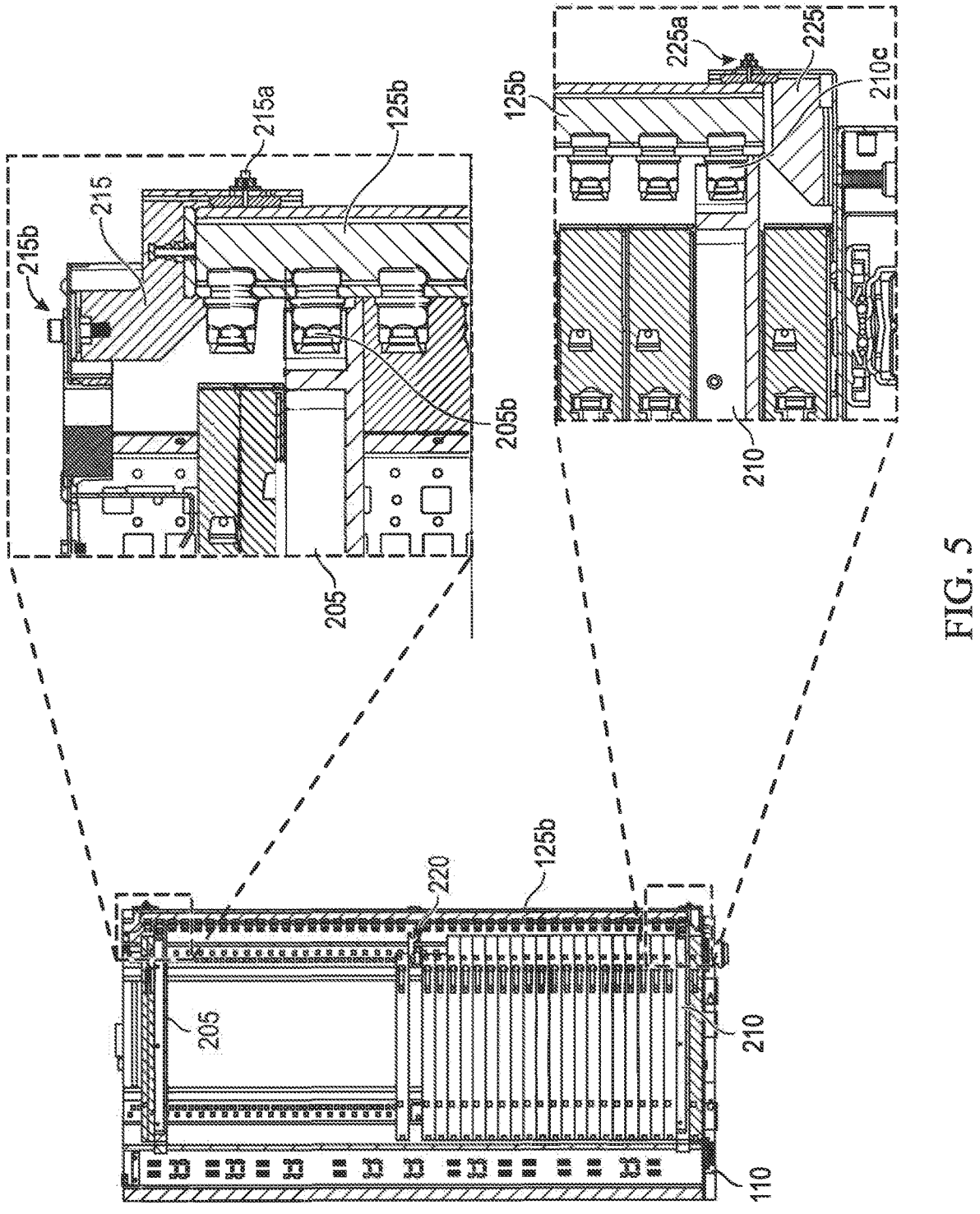
FIG. 5 is a side-view cutaway illustration of a rack that includes liquid cooling manifolds and alignment trays, according to embodiments, and a magnified view of the coupling of the top alignment tray, and a magnified view of the coupling of the bottom alignment tray.

FIG. 5 is a side-view cutaway illustration of a rack 110 that includes a liquid cooling manifold 125b and alignment trays 205, 210, according to embodiments, and a magnified view of the coupling of the top alignment tray 205, and a magnified view of the coupling of the bottom alignment tray 210. In FIG. 5, alignment trays 205, 210 have both been inserted into slots of the rack 110, with the top alignment tray 205 installed within the second topmost slot of the rack 110 and lower alignment tray 210 installing within the bottom slot of the rack. With the alignment trays 205, 210 fully installed, the alignment coupling 205b of the top alignment tray 205 is coupled to liquid cooling manifold 125b and the alignment coupling 210b of the lower alignment tray 210 is also coupled to liquid cooling manifold 125b.

As indicated in the side view of the full rack, liquid cooling manifold 125b is connected to rack 110 via brackets 215, 220, 225. As illustrated in the top magnified view, liquid cooling manifold 125b is fastened to top bracket 215 via fastener 215a, and the top bracket 215 is fixed to rack 110 via fastener 215b. In a similar manner, in the bottom magnified view, liquid cooling manifold 125b is fastened to bottom bracket 225 via fastener 225a, and the bottom bracket 225 is fixed to the base of rack 110. Middle bracket 220 may be fastened to the liquid cooling manifold 125b using a fastener, and may include structures for attaching the bracket to the cross brace 240 of the rack.

As described above, in some embodiments, the top alignment tray 205 and the lower alignment tray 210 may be identical. However, in some embodiments, differences in these may further promote precise alignment of the alignment trays with the liquid cooling manifolds 125a-b. For instance, in the magnified portions of FIG. 5, a small gap is present below the alignment coupling 205b of the top alignment tray 205, with no such gap present below the alignment coupling 210c of the lower alignment tray 210. Due to this difference, the liquid cooling manifolds 125a-b are ensured to be positioned vertically with respect to the lower alignment tray 210 with some vertical travel possible relative to the upper alignment tray 205, until brackets 215, 220, 225 have been fastened in place. This ensures vertical alignment with less possibility of any binding or torsion on the liquid cooling manifolds due to slight variances in the vertical positions of the slots in which the trays 205, 210 have been inserted.

In some embodiments, brackets 215, 220, 225 may be configured to allow fasteners, such as 225a, 215a-b, to be inserted and partially tightened such that these fasteners hold the liquid cooling manifolds 125a-b loosely in place. With limited movement of the liquid cooling manifolds 125a-b allowed by the play in the partially tightened brackets 215, 220, 225, an administrator inserts the alignment trays 205, 210 into the rack 110 and adjusts the liquid cooling manifolds 125a-b until the trays are seated and connected to the couplings of the liquid cooling manifolds 125a-b. As described, the alignment trays 205, 210 are further positioned using tabs 210c that prevent movement of the trays. With the alignment trays 205, 210 coupled to the liquid cooling manifolds 125a-b and positioned within the rack 110, an administrator may tighten the fasteners 225a, 215a-b such that brackets 215, 220, 225 now fix the liquid cooling manifolds 125a-b in their current positions. Once the fasteners 225a, 215a-b of the brackets 215, 220, 225 have been tightened, the alignment trays 205, 210, tabs 210c and clamps 310 are all removed from the rack 110 and further preparation of the rack 110 for receiving hardware may continue.

With the liquid cooling manifolds 125a-b aligned with the rack 110, IHSs and other hardware that uses quick-connect liquid cooling couplings may be blindly coupled to the manifolds by an administrator. Through such alignment, existing quick-connect couplings may be used, rather than initiating costly upgrades to each of the many liquid cooling couplings of a single liquid cooling manifold, and thus be each IHS that is connected to these manifolds. Aligned using the embodiments described herein, a sever IHS may be connected to liquid cooling manifolds 125a-b without having any visibility of the couplings are used in establishing these connections.

It should be understood that various operations described herein may be implemented in software executed by processing circuitry, hardware, or a combination thereof. The order in which each operation of a given method is performed may be changed, and various operations may be added, reordered, combined, omitted, modified, etc. It is intended that the invention(s) described herein embrace all such modifications and changes and, accordingly, the above description should be regarded in an illustrative rather than a restrictive sense.

The terms "tangible" and "non-transitory," as used herein, are intended to describe a computer-readable storage medium (or "memory") excluding propagating electromagnetic signals; but are not intended to otherwise limit the type of physical computer-readable storage device that is encompassed by the phrase computer-readable medium or memory. For instance, the terms "non-transitory computer readable medium" or "tangible memory" are intended to encompass types of storage devices that do not necessarily store information permanently, including, for example, RAM. Program instructions and data stored on a tangible computer-accessible storage medium in non-transitory form may afterwards be transmitted by transmission media or signals such as electrical, electromagnetic, or digital signals, which may be conveyed via a communication medium such as a network and/or a wireless link.

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. A method for aligning liquid cooling manifolds of a computing rack, the method comprising:

inserting a first alignment tray in a first slot of the rack until alignment couplings of the first alignment tray are coupled to a first liquid cooling manifold of the rack;

inserting a second alignment tray in a second slot of the rack until alignment couplings of the second alignment tray are coupled to the first liquid cooling manifold of the rack;

fastening the first liquid cooling manifold to the rack while the liquid cooling manifold is coupled to the first alignment tray and also coupled to the second alignment tray;

removing the first alignment tray and the second alignment tray from the rack; and inserting an IHS (Information Handling System) into a slot of the rack until a first liquid cooling coupling of the IHS is connected to a coupling of the first liquid cooling manifold, wherein the first liquid cooling coupling of the IHS is aligned with the coupling of the first liquid cooling manifold based on the fastening of the first liquid cooling manifold to the rack while the first liquid cooling manifold is coupled to the first alignment tray and the second alignment tray.

2. The method of claim 1, wherein the first alignment tray is inserted into a top slot of the rack and the second alignment tray is inserted into a bottom slot of the rack.

3. The method of claim 1, wherein the first alignment tray is identical to the second alignment tray.

4. The method of claim 1, wherein the first liquid cooling manifold is fastened to a top cover of the rack via top bracket.

5. The method of claim 4, wherein the first liquid cooling manifold is fastened to a base of the rack via bottom bracket.

6. The method of claim 5, wherein the first liquid cooling manifold is fastened to a cross brace of the rack via middle bracket.

7. The method of claim 6, wherein the fastening fixes the top bracket, bottom bracket and middle bracket to the first liquid cooling manifold and to the rack.

8. The method of claim 7, wherein the first liquid cooling manifold is loosely attached to the rack by the top bracket, bottom bracket and middle bracket until the fastening fixes the brackets.

9. The method of claim 1, further comprising fastening a second liquid cooling manifold to the rack while the second liquid cooling manifold is coupled to alignment couplings of the first alignment tray and also coupled to alignment couplings of the second alignment tray.

10. The method of claim 9, wherein a second liquid cooling coupling of the IHS is aligned with the coupling of the second liquid cooling manifold based on the fastening of the second liquid cooling manifold to the rack while the second liquid cooling manifold is coupled to the first alignment tray and the second alignment tray.

11. A system for aligning liquid cooling manifolds of a computing rack, the system comprising:

a first liquid cooling manifold;

a first alignment tray that is inserted in a first slot of the rack until alignment couplings of the first alignment tray are coupled to the first liquid cooling manifold; and a second alignment tray that is inserted in a second slot of the rack until alignment couplings of the second alignment tray are coupled to the first liquid cooling manifold of the rack, wherein the first liquid cooling manifold is fastened to the rack while the liquid cooling manifold is coupled to the first alignment tray and also coupled to the second alignment tray, and wherein the first alignment tray and the second alignment tray are removed from the rack and an IHS (Information Handling System) is inserted into a slot of the rack until a liquid cooling coupling of the IHS is connected to a coupling of the first liquid cooling manifold, wherein the liquid cooling coupling of the IHS is aligned with the coupling of the first liquid cooling manifold based on the fastening of the first liquid cooling manifold to the rack while the liquid cooling manifold is coupled to the first alignment tray and the second alignment tray.

12. The system of claim 11, wherein the first alignment tray is inserted into a top slot of the rack and the second alignment tray is inserted into a bottom slot of the rack.

13. The system of claim 11, wherein the first liquid cooling manifold is fastened to a top cover of the rack via top bracket, the first liquid cooling manifold is fastened to a base of the rack via bottom bracket, and the first liquid cooling manifold is fastened to a cross brace of the rack via middle bracket.

14. The system of claim 13, wherein the fastening fixes the top bracket, bottom bracket and middle bracket to the first liquid cooling manifold and to the rack.

15. The system of claim 14, wherein the first liquid cooling manifold is loosely attached to the rack by the top bracket, bottom bracket and middle bracket until the fastening fixes the brackets.

16. A computing rack comprising a plurality of slots for installation of Information Handling Systems (IHSs), the rack comprising:

a first liquid cooling manifold;

a first alignment tray that is inserted in a first slot of the rack until alignment couplings of the first alignment tray are coupled to the first liquid cooling manifold; and a second alignment tray that is inserted in a second slot of the rack until alignment couplings of the second alignment tray are coupled to the first liquid cooling manifold of the rack, wherein the first liquid cooling manifold is fastened to the rack while the liquid cooling manifold is coupled to the first alignment tray and also coupled to the second alignment tray, and wherein the first alignment tray and the second alignment tray are removed from the rack and a first IHS is inserted into a slot of the rack until a liquid cooling coupling of the IHS is connected to a coupling of the first liquid cooling manifold, wherein the liquid cooling coupling of the first IHS is aligned with the coupling of the first liquid cooling manifold based on the fastening of the first liquid cooling manifold to the rack while the liquid cooling manifold is coupled to the first alignment tray and the second alignment tray.

17. The rack of claim 16, wherein the first alignment tray is inserted into a top slot of the rack and the second alignment tray is inserted into a bottom slot of the rack.

18. The rack of claim 16, wherein the first liquid cooling manifold is fastened to a top cover of the rack via top bracket, the first liquid cooling manifold is fastened to a base of the rack via bottom bracket, and the first liquid cooling manifold is fastened to a cross brace of the rack via middle bracket.

19. The rack of claim 18, wherein the fastening fixes the top bracket, bottom bracket and middle bracket to the first liquid cooling manifold and to the rack.

20. The rack of claim 19, wherein the first liquid cooling manifold is loosely attached to the rack by the top bracket, bottom bracket and middle bracket until the fastening fixes the brackets.

\* \* \* \* \*